US011828636B2

(12) United States Patent
Ono et al.

(10) Patent No.: US 11,828,636 B2
(45) Date of Patent: Nov. 28, 2023

(54) FLOW RATE SENSOR

(71) Applicant: Hitachi Automotive Systems, Ltd., Hitachinaka (JP)

(72) Inventors: Kazuo Ono, Tokyo (JP); Masahiro Matsumoto, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 585 days.

(21) Appl. No.: 17/254,697

(22) PCT Filed: May 20, 2019

(86) PCT No.: PCT/JP2019/019937
§ 371 (c)(1),
(2) Date: Dec. 21, 2020

(87) PCT Pub. No.: WO2020/039669
PCT Pub. Date: Feb. 27, 2020

(65) Prior Publication Data
US 2021/0116274 A1 Apr. 22, 2021

(30) Foreign Application Priority Data
Aug. 24, 2018 (JP) .................. 2018-156965

(51) Int. Cl.
*G01F 1/60* (2006.01)
(52) U.S. Cl.
CPC ..................... *G01F 1/60* (2013.01)
(58) Field of Classification Search
CPC ....................................................... G01F 1/60
(Continued)

(56) References Cited

U.S. PATENT DOCUMENTS

2013/0093432 A1 4/2013 Matsumoto et al.
2017/0089984 A1* 3/2017 Sakai .................. G01R 31/389

FOREIGN PATENT DOCUMENTS

JP 2012-8014 A 1/2012

OTHER PUBLICATIONS

International Search Report (PCT/ISA/210) issued in PCT Application No. PCT/JP2019/019937 dated Aug. 13, 2019 with English translation (three (3) pages).
(Continued)

Primary Examiner — Aditya S Bhat
(74) Attorney, Agent, or Firm — Crowell & Moring LLP

(57) ABSTRACT

In a flow rate sensor 10, a resistance bridge 100 detects a change in a gas flow rate. A differential A/D converter 122 converts an analog signal output from the resistance bridge 100 into a digital signal. A disconnection detection circuit 130 detects disconnection of bonding wires 164, 165 that connect the differential A/D converter 122 and the resistance bridge 100. The disconnection detection unit 130 includes a detection capacitance 141 and a comparator 145. One connection portion of the detection capacitance 141 is connected to an input node of the A/D converter 122. The comparator 145 detects the disconnection of the bonding wires 164, 165 based on a potential based on a ratio of an electrostatic capacitance of a P-side input capacitance 116 or a N-side input capacitance 117 to an electrostatic capacitance of the detection capacitance 141. The P-side input capacitance 116 and the N-side input capacitance 117 respectively are connected to operation input units of the differential A/D converter 122.

15 Claims, 10 Drawing Sheets

(58) Field of Classification Search
USPC .......................................................... 702/57
See application file for complete search history.

(56) References Cited

OTHER PUBLICATIONS

Japanese-language Written Opinion (PCT/ISA/237) issued in PCT Application No. PCT/JP2019/019937 dated Aug. 13, 2019 (three (3) pages).

\* cited by examiner

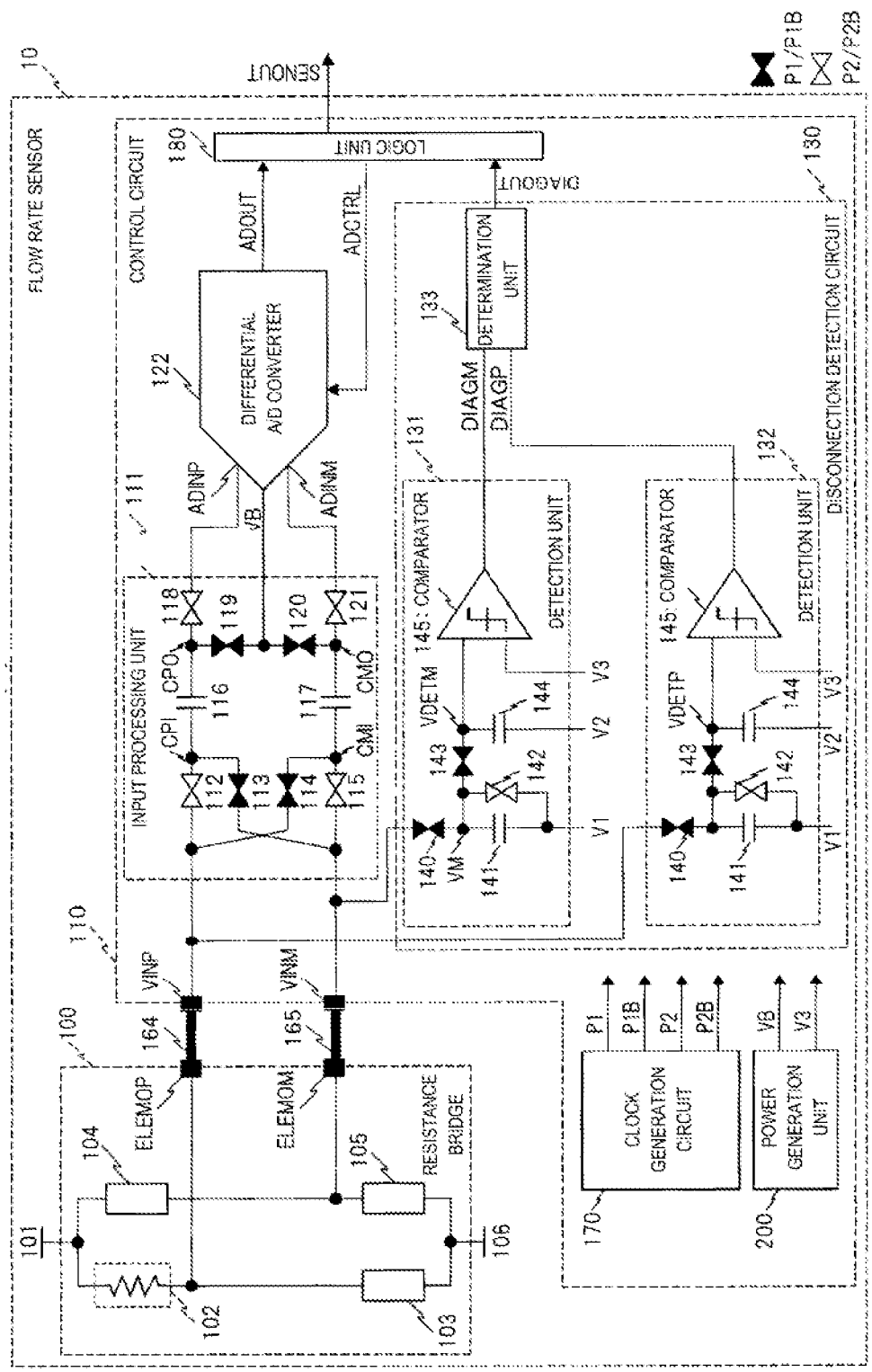
[FIG. 1]

[FIG. 2]
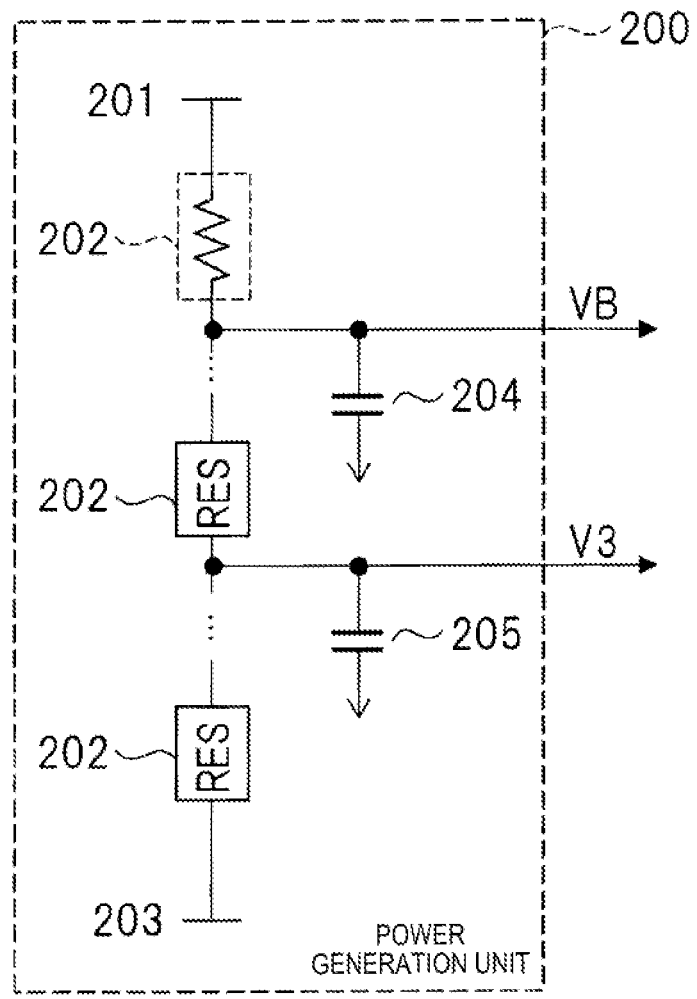

[FIG. 3]
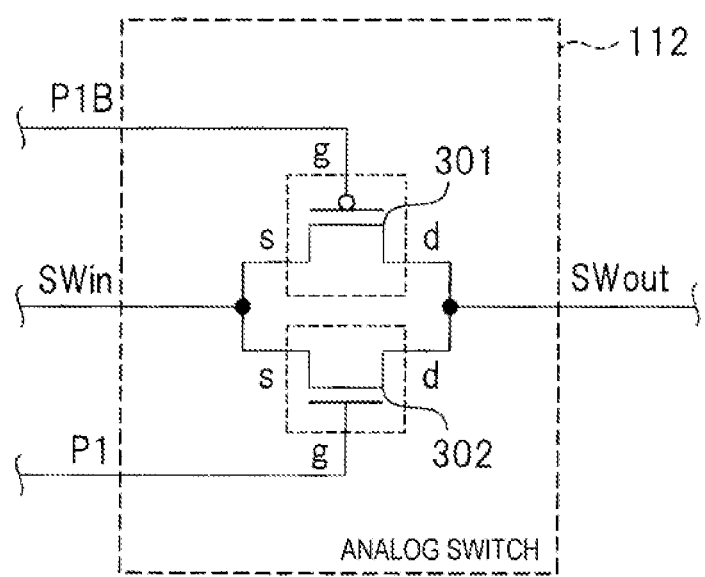

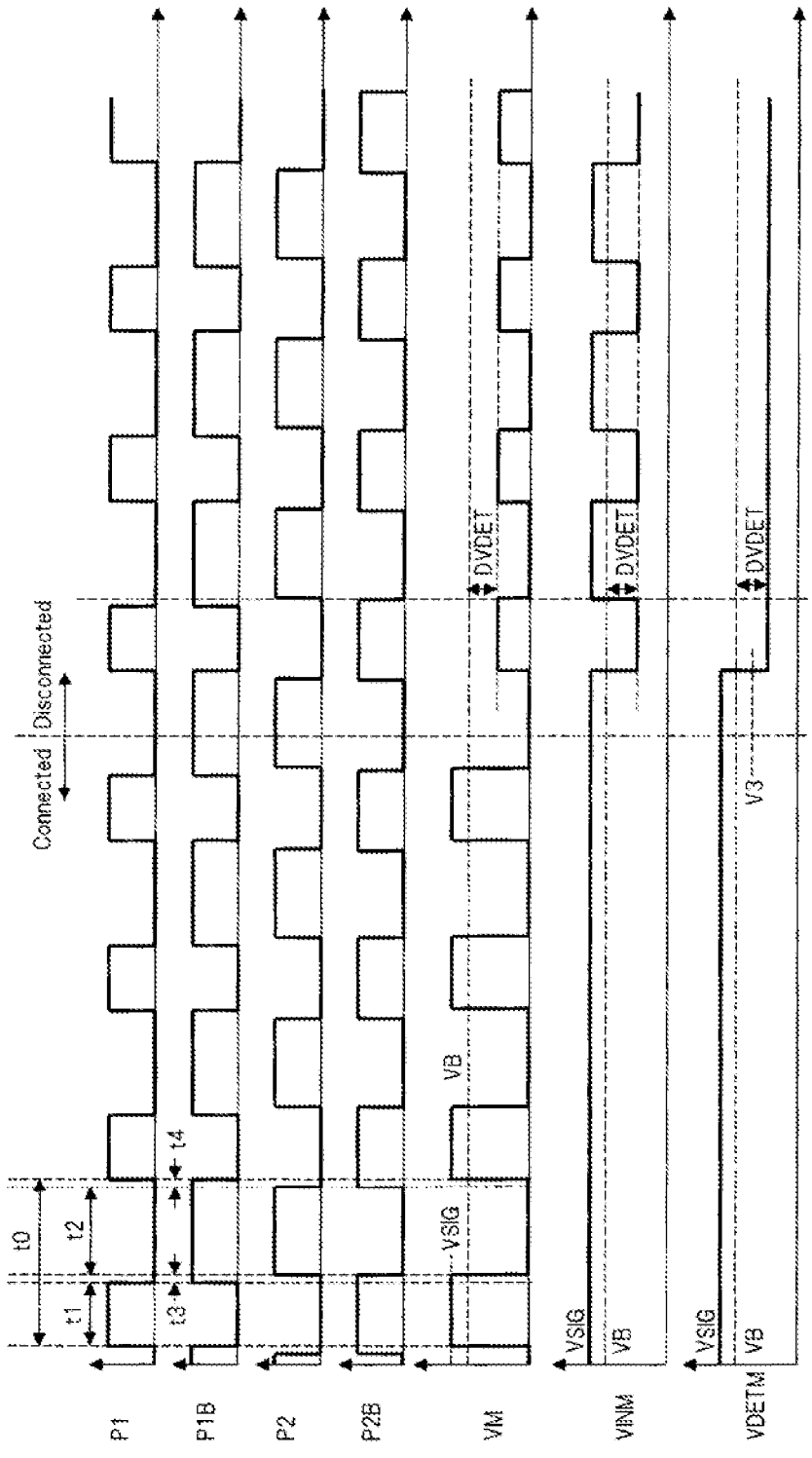
[FIG. 4]

[FIG. 5]
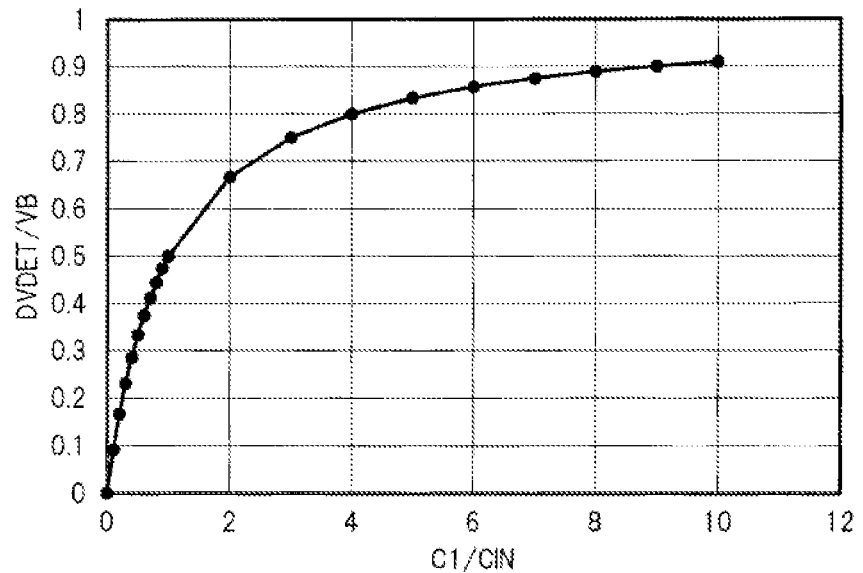
[FIG. 6]
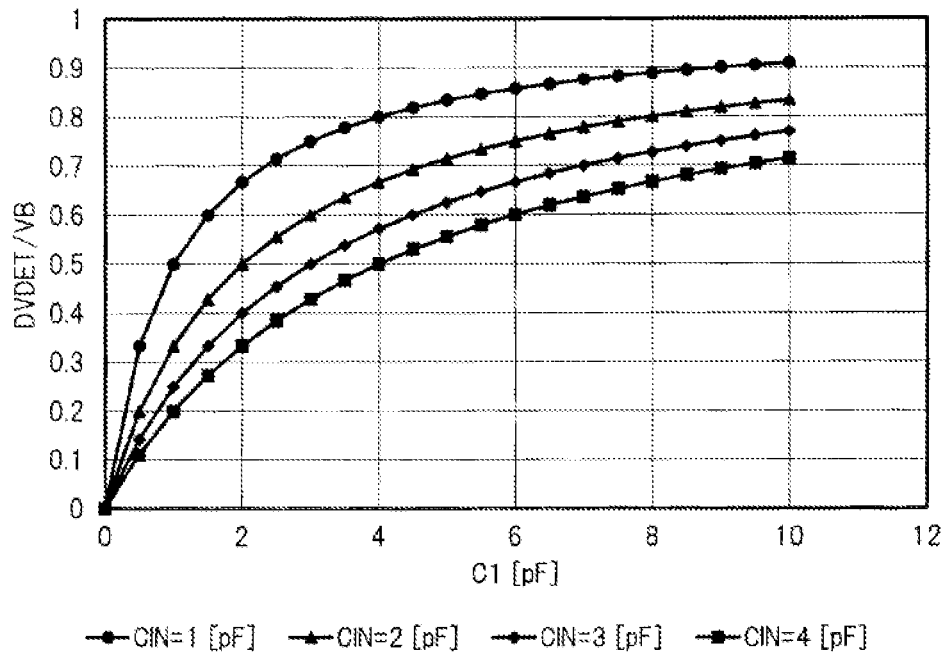

FIG. 7A
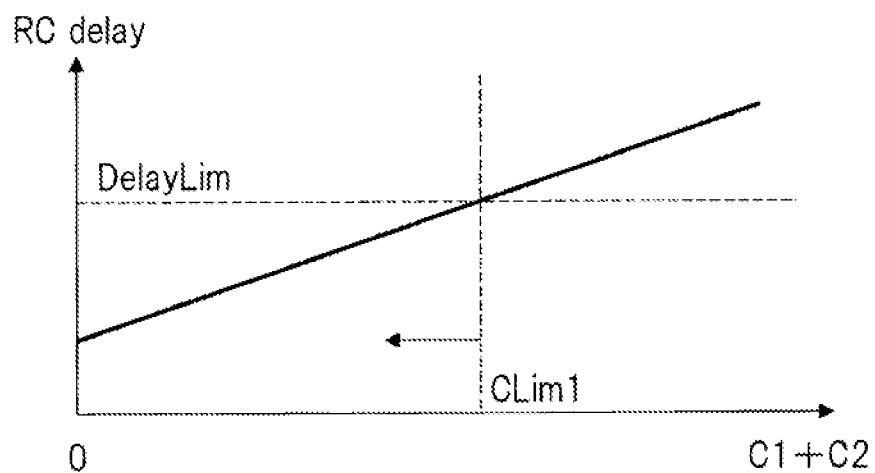
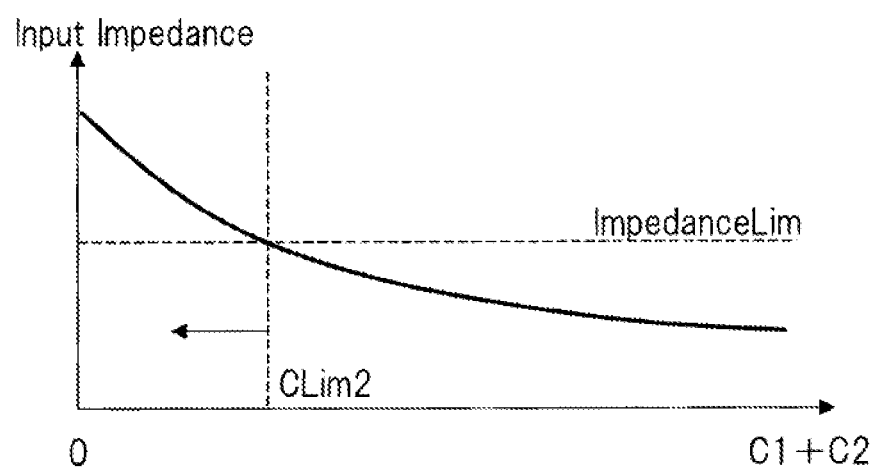
FIG. 7B

[FIG. 8]
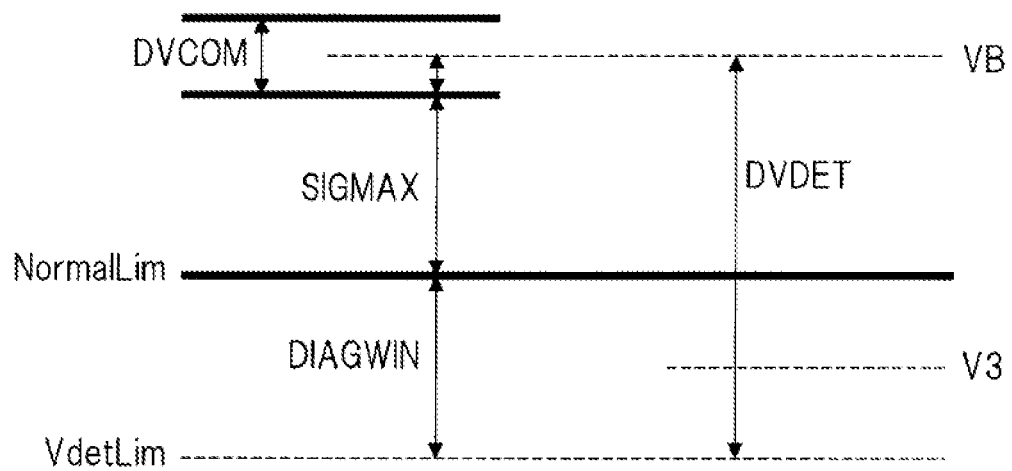
[FIG. 9]
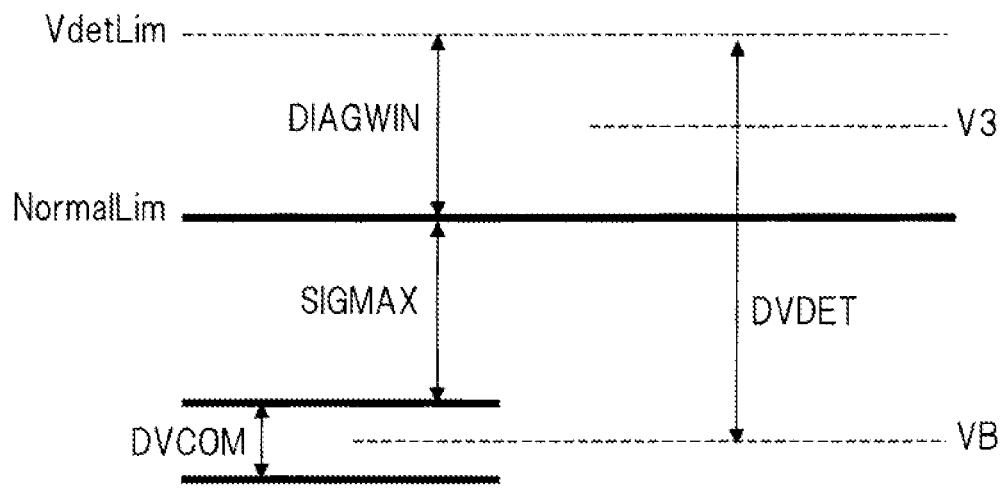

[FIG. 10]
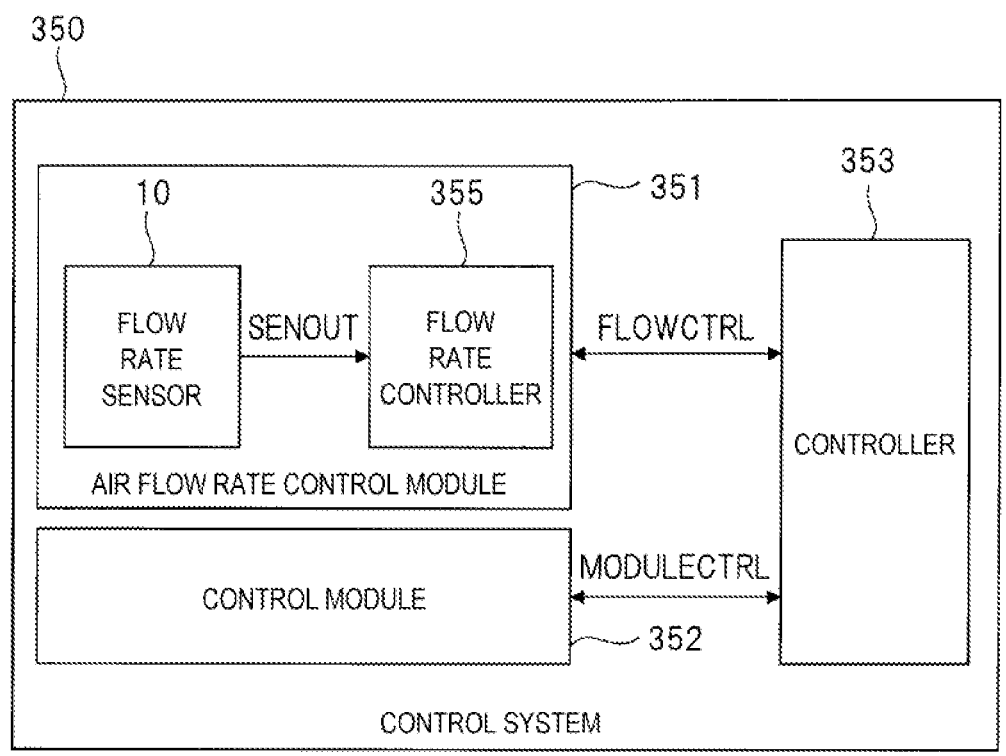

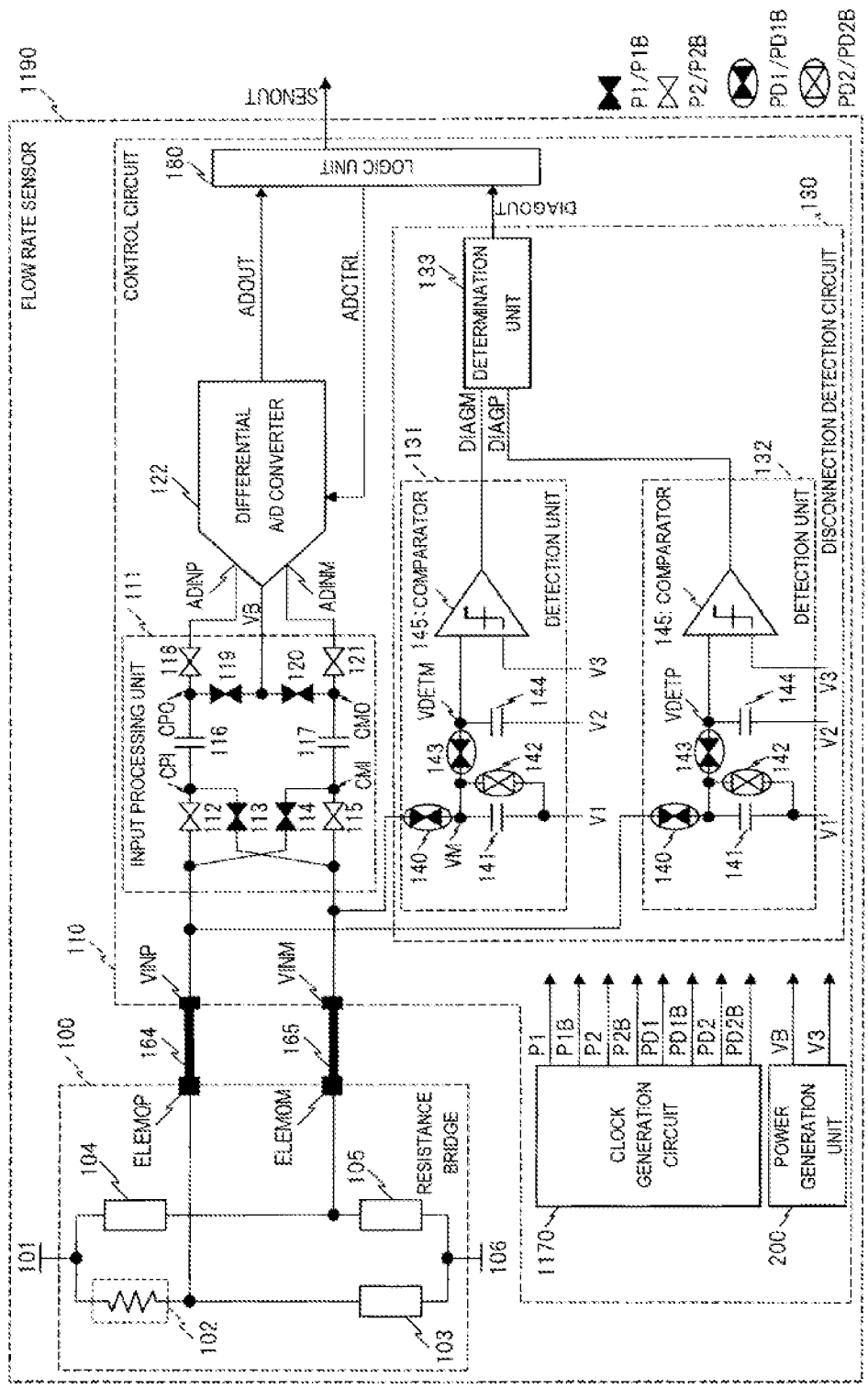
[FIG. 11]

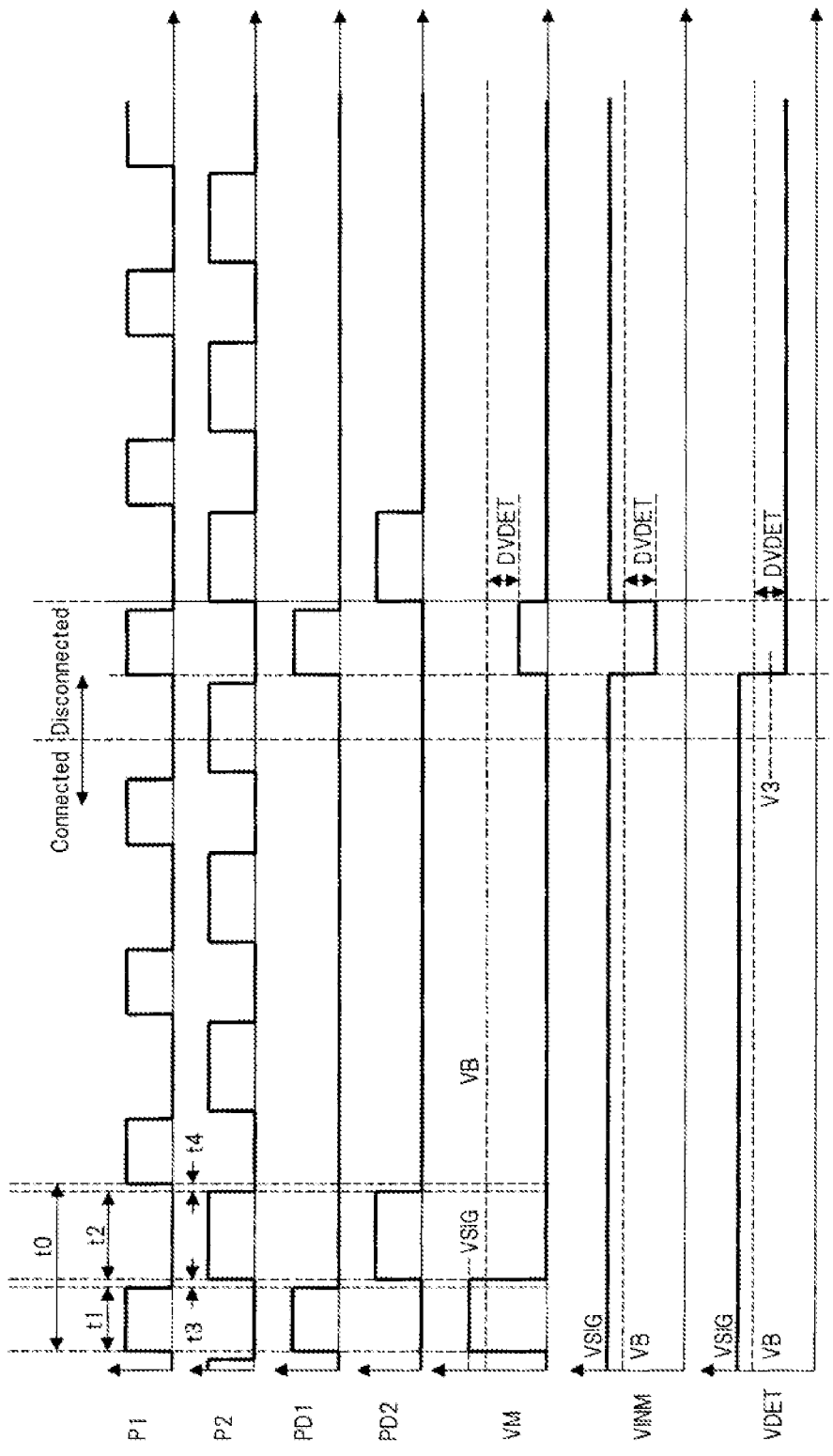

FLOW RATE SENSOR

TECHNICAL FIELD

The present invention relates to a flow rate sensor, and more particularly to a technique effective for detecting disconnection in a flow rate sensor that measures a flow rate of air supplied to an internal combustion engine and the like.

BACKGROUND ART

Flow rate sensors are widely used to control an amount of air flowing into internal combustion engines that use fossil fuels, such as automobile engines. This is because, in particular, a demand for improving fuel efficiency in automobiles requires that a mixing ratio of air and gasoline is kept optimal to realize efficient combustion.

There are various indicators of performance required for automobile engines, and even on a global scale, the required performance varies from region to region. For example, in the case of Japan, when driving in urban areas, there are unique circumstances such as frequent stop-and-go traffic lights and frequent traffic jams. In this case, since it is necessary to perform the efficient combustion even when an engine output is small, the flow rate sensor is required to accurately detect minute changes in an air flow rate.

As a detection method of the flow rate sensor, for example, a method using a resistance bridge circuit is known. It is detected that a resistance value used in the resistance bridge circuit changes due to air flow, and the change is converted into the air flow rate.

An analog signal detected by the resistance bridge circuit is converted into a digital signal by an Analog/Digital (A/D) converter. Various types of A/D converters are known, but the A/D converters can be roughly divided into a sampling hold type that uses a switched capacitor and a continuous type that uses a resistor. A switched capacitor type is widely used since this type of converter can improve accuracy, consumes less power, and has a less characteristic fluctuation caused by fluctuations in environmental temperatures.

However, in the switched capacitor type A/D converter, when an input unit of the A/D converter and an output unit of the bridge circuit are disconnected, the input unit of the A/D converter becomes floating, and it is difficult to determine a difference from a state in which the bridge circuit is normally connected.

As a result, adjustment and control of an air-fuel mixture of the engine do not work normally, the fuel consumption deteriorates, and a concern on emission of environmental gases increases.

As a technique considering the disconnection between the bridge circuit and the A/D converter, for example, there is a technique for detecting disconnection between the bridge circuit and the A/D converter by providing a disconnection detection circuit at the input unit of the A/D converter (see PTL 1).

CITATION LIST

Patent Literature

PTL 1: JP-A-2012-8014

SUMMARY OF INVENTION

Technical Problem

The disconnection detection technique according to PTL 1 described above shows the disconnection detection circuit. The disconnection detection circuit detects disconnection using a fact that a minute current continues to flow from a DC current source to the input unit of the A/D converter, and when the disconnection occurs, the current of the current source stops flowing.

However, in this disconnection detection technique, since the detection current always continues to flow, there is a lack of consideration for deterioration of conversion accuracy of the A/D converter due to fluctuations in a current value of the detected current or fluctuations in a resistance value used in the bridge circuit.

Therefore, in the flow rate sensor provided with the A/D converter that converts the minute signal having a small flow rate into the digital signal, the conversion accuracy may be deteriorated, and engine malfunction, deterioration of the fuel efficiency, and the like may become noticeable.

An object of the invention is to provide a technique capable of detecting disconnection of a wiring without decreasing detection accuracy of a gas flow rate.

The above and other objects and novel features of the invention will become apparent based on the description of this specification and the accompanying drawings.

Solution to Problem

The typical ones of the inventions disclosed in the present application will be briefly described as follows.

That is, a typical flow rate sensor includes a sensor unit, an A/D converter, and a disconnection detection circuit. The sensor unit detects a change in a gas flow rate. The A/D converter is a switched capacitor type A/D converter, and converts an analog signal output from the sensor unit into a digital signal.

The disconnection detection circuit includes a first capacitor and a detection unit. One connection portion of the first capacitor is connected to an input node of the A/D converter, and the detection unit detects disconnection of a wiring. This detection unit detects the disconnection of the wiring based on a potential based on a ratio of each of electrostatic capacitances of input capacitors connected to operation input units of the A/D converter to an electrostatic capacitance of the first capacitor.

One connection portion of the disconnection detection circuit is connected to the input node of the A/D converter, and the disconnection detection circuit includes a second capacitor (holding capacitance 144) that holds an electric charge of a potential in the first capacitor. The detection unit detects the disconnection of the wiring based on a potential fluctuation of the second capacitor.

Advantageous Effect

Effects attained by typical ones of the inventions disclosed in the present application will be briefly described as follows.

(1) The disconnection of the wiring can be detected without decreasing detection accuracy of the gas flow rate.

(2) According to the above (1), reliability of the flow rate sensor can be improved.

BRIEF DESCRIPTION OF DRAWINGS

FIG. 1 is an illustrative diagram showing an example of a configuration of a flow rate sensor according to an embodiment.

FIG. 2 is an illustrative diagram showing an example of a configuration of a power generation unit provided in the flow rate sensor in FIG. 1.

FIG. 3 is an illustrative diagram showing an example of a configuration of an analog switch provided in the flow rate sensor in FIG. 1.

FIG. 4 is a timing chart schematically showing timings of signals of units in a detection unit provided in a flow rate sensor in FIG. 1.

FIG. 5 is an illustrative diagram showing relation between a capacitance ratio of an N-side input capacitance to a detection capacitance and a voltage ratio of a potential fluctuation to a reference potential that are provided in the flow rate sensor in FIG. 1.

FIG. 6 is an illustrative diagram showing dependence of the detection capacitance provided in the flow rate sensor in FIG. 1.

FIGS. 7A and 7B are illustrative diagrams showing examples of signal characteristics generated by an electrostatic capacitance sum of the detection capacitance and a holding capacitance that are provided in the flow rate sensor in FIG. 1.

FIG. 8 is an illustrative diagram showing an example of an operation window in a circuit operation in a disconnection detection circuit provided in the flow rate sensor in FIG. 1.

FIG. 9 is an illustrative diagram showing another example of the operation window in the circuit operation in the disconnection detection circuit provided in the flow rate sensor in FIG. 1.

FIG. 10 is an illustrative diagram showing an example of a configuration of a control system provided with the flow rate sensor in FIG. 1.

FIG. 11 is an illustrative diagram showing an example of a configuration of a flow rate sensor according to a second embodiment.

FIG. 12 is a timing chart schematically showing a clock and an internal waveform in the detection unit provided in the flow rate sensor in FIG. 11.

DESCRIPTION OF EMBODIMENTS

In all the drawings describing the embodiments, the same members are denoted by the same reference numerals in principle, and the repetitive description thereof will be omitted.

First Embodiment

Hereinafter, an embodiment will be described in detail. (Configuration Example and Operation of Flow Rate Sensor)

FIG. 1 is an illustrative diagram showing an example of a configuration of a flow rate sensor 10 according to the present embodiment.

The flow rate sensor 10 is a sensor that measures a flow rate of air or the like, and is used for an internal combustion engine such as an engine provided in an automobile or the like.

As shown in FIG. 1, the flow rate sensor 10 includes a resistance bridge 100 and a control circuit 110. The resistance bridge 100 and the control circuit 110 are formed on, for example, a semiconductor chip.

The resistance bridge 100, which is a sensor unit, includes four resistors 102 to 105, and detects a change in a flow rate of a gas. The resistor 102 and the resistor 103 are series-connected. Similarly, the resistor 104 and the resistor 105 are also series-connected.

One connection portion of the resistor 102 and one connection portion of the resistor 104 are commonly connected to each other, and the other connection portion of the resistor 103 and the other connection portion of the resistor 105 are also commonly connected to each other.

A first potential 101 is supplied to a node to which the one connection portion of the resistor 102 and the one connection portion of the resistor 104 are connected. A second potential 106 is supplied to a node to which the other connection portion of the resistor 103 and the other connection portion of the resistor 105 are connected.

The first potential 101 and the second potential 106 are supplied from an outside of the flow rate sensor 10. Alternatively, the first potential 101 and the second potential 106 may be supplied from a power supply circuit (not shown) provided in the control circuit 110, a power generation unit 200 described later, or the like. In any case, it is desirable that the first potential 101 and the second potential 106 are power supplies stabilized using an electrostatic capacitance or the like.

The resistance bridge 100 includes an output unit ELEMOP and an output unit ELEMOM. A connection portion between the resistor 102 and the resistor 103 that are series-connected is the output unit ELEMOP, and a connection portion between the resistor 104 and the resistor 105 that are series-connected is the output unit ELEMOM.

The output unit ELEMOP of the resistance bridge 100 is connected to an input unit VINP provided in the control circuit 110 by a bonding wire 164. The output unit ELEMOM of the resistance bridge 100 is connected to an input unit VINM provided in the control circuit 110 by a bonding wire 165. Hereinafter, disconnection means that the bonding wire 164 or the bonding wire 165 described above is disconnected.

The control circuit 110 includes an input processing unit 111, a differential A/D converter 122, a disconnection detection circuit 130, a clock generation circuit 170, a logic unit 180, and the power generation unit 200.

The input processing unit 111 includes analog switches 112 to 115 and 118 to 121, a P-side input capacitance 116, and an N-side input capacitance 117. One connection portion of the analog switch 112 which is a first switch and one connection portion of the analog switch 114 which is a third switch are connected to the input unit VINP. One connection portion of the analog switch 113 which is a second switch and one connection portion of the analog switch 115 which is a fourth switch are respectively connected to the input unit VINM.

The other connection portions of the analog switches 112, 113 are connected to one connection portion of the P-side input capacitance 116. A connection portion between the analog switches 112, 113 and the P-side input capacitance 116 is a node CPI.

The other connection portions of the analog switches 114, 115 are connected to one connection portion of the N-side input capacitance 117. A connection portion between the analog switches 114, 115 and the N-side input capacitance 117 is a node CMI.

One connection portion of the analog switch 118 and one connection portion of the analog switch 119 are respectively connected to the other connection portion of the P-side input capacitance 116 which is an input capacitor. One connection portion of the analog switch 120 and one connection portion of the analog switch 121 are respectively connected to the other connection portion of the N-side input capacitance 117 which is an input capacitor.

The other connection portion of the analog switch 120 is connected to the other connection portion of the analog switch 119. A power input unit of the differential A/D converter 122 is connected to a connection portion of the analog switch 119 and the analog switch 120. A reference potential VB is input from the connection portion of the analog switch 119 and the analog switch 120 to this power input unit.

The other connection portion of the analog switch 118 is connected to a P-side input unit ADINP of the differential A/D converter 122, and the other connection portion of the analog switch 121 is connected to an N-side input unit ADINM of the differential A/D converter 122.

An output signal ADOUT is output from an output unit of the differential A/D converter 122. The output signal ADOUT is input to the logic unit 180. The logic unit 180 executes correction operations such as temperature correction, pulsation correction, and humidity correction on the output signal ADOUT, and transmits flow rate information to a higher-level system such as an engine electronic control unit (ECU) that is responsible for control of an engine.

A control terminal of the differential A/D converter 122 is connected, so that a control signal ADCTRL output from the logic unit 180 is input to the control terminal. The differential A/D converter 122 is, for example, a sampling hold type differential input A/D converter.

The clock generation circuit 170 generates and outputs clock signals of clocks P1, P1B, P2, P2B. The clock P1B is an inverted clock of the clock P1, and the clock P2B is an inverted clock of the clock P2. The clocks P1, P1B are first control clocks, and the clocks P2, P2B are second control clocks.

On/off operations of the analog switches 112, 115, 118, 121 shown by being printed in white in FIG. 1 are controlled by the clock P1 and the clock P1B that are generated by the clock generation circuit 170.

On/off operations of the analog switches 113, 114, 119, 120 shown by being printed in black in FIG. 1 are controlled by the clock P2 and the clock P2B that are generated by the clock generation circuit 170. The clocks P1, P2 are also used as control clocks for the differential A/D converter 122 to control an A/D conversion operation.

Here, time when the clock P1=HIGH is Phase 1, and time when the clock P2=HIGH is Phase 2. In the Phase 2, the input unit VINP of the control circuit 110, the P-side input capacitance 116, and the P-side input unit ADINP of the differential A/D converter 122 are series-connected.

At this time, the input unit VINM of the control circuit 110, the N-side input capacitance 117, and the N-side input unit ADINM of the differential A/D converter 122 are series-connected, so that an operation of capturing the signal is performed by the differential A/D converter 122.

On the other hand, in the Phase 1, the input unit VINP of the control circuit 110, the N-side input capacitance 117, and the power input unit of the differential A/D converter 122 are series-connected. At this time, the input unit VINM of the control circuit 110, the P-side input capacitance 116, and the power input unit of the differential A/D converter 122 are series-connected, so that signal sampling is performed on the P-side input capacitance 116 and the N-side input capacitance 117.

When transitioning from the Phase 1 (or Phase 2) to the Phase 2 (Phase 1), a potential connected to the node CPI changes from a P side to an N side, and a potential connected to the node CMI changes from the N side to the P side. Therefore, during an input of the differential A/D converter 122, a state of removing a common mode of an output of the resistance bridge 100 is implemented. Accordingly, a dynamic range of the differential A/D converter 122 can be increased, and as a result, highly accurate A/D conversion can be implemented.

The disconnection detection circuit 130 includes a disconnection detection unit 131, a disconnection detection unit 132, and a determination unit 133. The disconnection detection unit 131 detects disconnection of the bonding wire 164 which is a wiring. The disconnection detection unit 132 detects disconnection of the bonding wire 165 which is a wiring.

The determination unit 133, which is a disconnection determination unit, determines whether or not the bonding wires 164, 165 are disconnected based on a determination signal DIAGM output from the disconnection detection unit 131 and a determination signal DIAGP output from the disconnection detection unit 132. Then, when it is determined that either the bonding wire 164 or the bonding wire 165 is disconnected, a disconnection detection signal DIAGOUT is output to the logic unit 180.

The disconnection detection unit 131 includes analog switches 140, 142, 143, a detection capacitance 141, a holding capacitance 144, and a comparator 145.

One connection portion of the analog switch 140 which is a fifth switch is connected to the input unit VINM of the control circuit 110. One connection portion of the detection capacitance 141, one connection portion of the analog switch 142, and one connection portion of the analog switch 143 are respectively connected to the other connection portion of the analog switch 140. A connection portion of the analog switch 140, the detection capacitance 141, and the analog switches 142, 143 is a node VM.

The other connection portion of the analog switch 142 which is a sixth switch is connected to the other connection portion of the detection capacitance 141 which is a first capacitor. The analog switch 142 is connected to the detection capacitance 141, so that a detection reference potential V1, which is a first detection reference voltage, is input to a connection portion of the detection capacitance 141 and the analog switch 142.

One connection portion of the holding capacitance 144 and one input unit of the comparator 145 are connected to the other connection portion of the analog switch 143 which is a seventh switch. A connection portion of the analog switch 143, the holding capacitance 144, and the comparator 145 is a detection node VDETM.

The other connection portion of the holding capacitance 144 which is a second capacitor is connected so that a detection reference potential V2 is input to the other connection portion of the holding capacitance 144, and the other input unit of the comparator 145 is connected so that a detection reference potential V3 is input to the other input unit of the comparator 145. The detection reference potential V2, which is a second detection reference potential, is a potential different from the detection reference potential V1.

The power generation unit 200 generates the detection reference potential V3 and the reference potential VB. The detection reference potential V3 and the reference potential VB may be supplied from the outside of the flow rate sensor 10.

Similarly, the detection reference potentials V1, V2 may be supplied from the outside of the flow rate sensor 10. Alternatively, the power generation unit 200 may generate the detection reference potentials V1, V2, or a new power generation unit may be provided in the flow rate sensor 10 to generate the detection reference potentials V1, V2.

The comparison signal DIAGM is output as a comparison result from an output unit of the comparator 145. The comparison signal DIAGM is connected, so that the comparison signal DIAGM is input to the other input unit of the determination unit 133.

Here, a configuration of the disconnection detection unit 132 is similar to that of the disconnection detection unit 131, and is different only in that the one connection portion of the analog switch 140 of the disconnection detection unit 132 is connected to the input unit VINM of the control circuit 110, and the comparison signal DIAGP, which is the comparison result, is input to the other input unit of the determination unit 133 from the output unit of the comparator 145.

Subsequently, operations of the disconnection detection unit 131 will be described.

Here, since the configurations of the disconnection detection unit 131 and the disconnection detection unit 132 are the same as described above, the description will be given to the disconnection detection unit 131.

The analog switch 142 operates on the clock P2 generated by the clock generation circuit 170, and the analog switches 140, 143 operate on the clock P1 generated by the clock generation circuit 170.

The comparator 145, which is a detection unit, compares potential magnitude relation between the detection node VDETM, which is a potential based on the detection capacitance 141 and the holding capacitance 144, and the detection reference potential V3, and outputs the comparison signal DIAGM from the output unit as the comparison result of the potential magnitude relation.

The analog switch 142 has a role of discharging the detection capacitance 141 in the Phase 2 described above. The disconnection detection unit 131 is connected to the input unit VINM of the control circuit 110 at the time of Phase 1, and at that time, disconnection detection operation of the bonding wire 165 is performed. In the Phase 2, the disconnection detection unit 131 is disconnected from the input unit VINM.

The differential A/D converter 122 is connected to the input unit VINM of the control circuit 110 in the Phase 2 and is disconnected in the Phase 1. Therefore, the disconnection detection unit 131 is disconnected from an input node of the differential A/D converter 122 during the operation of capturing the signal of the differential A/D converter 122.

Therefore, noise generated by the disconnection detection circuit 130 during the operation of capturing the signal of the differential A/D converter 122 can be blocked, and the highly accurate A/D conversion can be implemented.

A potential of the detection node VDETP is determined by a ratio of an electrostatic capacitance value CIN of the P-side input capacitance 116, an electrostatic capacitance value C1 of the detection capacitance 141, and an electrostatic capacitance value C2 of the holding capacitance 144, and is obtained by $VDETM=(VB-V1)\times CIN/(CIN+C1+C2)$.

The electrostatic capacitance value C2 is provided only for a purpose of holding. As long as a potential of the detection node VDETM can be held, a parasitic capacitance of the wiring, a gate capacitance of an input transistor provided in the comparator 145, and the like may be utilized, and the electrostatic capacitance value C2 may be a very small electrostatic capacitance.

In this case, no obvious capacitance element is checked on a circuit layout of the semiconductor chip on which the flow rate sensor 10 is formed. However, it is preferable in that a charge holding function provided by the electrostatic capacitance value C2 is attained and a circuit area can be reduced.

Since the electrostatic capacitance value C1 is dominant as compared with the electrostatic capacitance value C2, the above equation is simplified as $VDETM=(VB-V1)\times CIN/(CIN+C1)$.

Here, it is advantageous in the following points that the potential of the detection node VDETM is determined by the ratio of the electrostatic capacitance.

In an integrated circuit, since a manufacturing variation of a capacitance is small, a potential variation in the detection node VDETM can be reduced. Further, effect of canceling the variation can be expected by obtaining a capacitance ratio.

When the potential variation in the detection node VDETM becomes small, likelihood of setting the detection reference potential V3 increases, so that a circuit design can be simplified. By setting the detection reference potential V1 to a potential lower than a ground (GND) potential which is a reference potential, a potential fluctuation (DVDET) of the detection node VDETM can be increased. Accordingly, a design of the comparator 145 and potential setting of the detection reference potential V3 can be facilitated.

A potential of the detection reference potential V1 may be lower or higher than the reference potential VB. For example, when a step-up power supply or the like is already prepared on the semiconductor chip constituting the flow rate sensor 10, it is preferable to set the detection reference potential V1 is higher than the reference potential VB.

This is because it is common to use the step-up power supply that is higher than an operating power supply of an analog circuit, not a negative power supply that is lower than the GND potential. A voltage of the detection reference potential V2 may basically be the GND potential, and can be designed to any potential that is convenient for circuit operations.

The determination unit 133 is, for example, an OR circuit, and obtains an OR (logical sum) of the determination signal DIAGM output from the disconnection detection unit 131 and the determination signal DIAGP output from the disconnection detection unit 132.

When either disconnection of the bonding wire 164 on an input unit VINP side or disconnection of the bonding wire 165 on an input unit VINM side occurs, the control circuit 110 cannot operate normally.

Therefore, when either the bonding wire 164 or the bonding wire 165 is disconnected, disconnection information is included in a sensor signal SENOUT output from the logic unit 180, which is an output of the flow rate sensor 10, so as to notify a higher-level system such as a controller 353 shown in FIG. 10.

From a viewpoint of power consumption, it is not preferable to operate the differential A/D converter 122 in a state where the control circuit 110 cannot operate normally, so that it is preferable to immediately give feedback when the disconnection of the bonding wire 164 or the disconnection of the bonding wire 165 is detected to stop an operation of the differential A/D converter 122.

In this case, the logic unit 180 outputs the control signal ADCTRL to the control terminal of the differential A/D converter 122 when the disconnection detection signal DIAGOUT is output from the determination unit 133. The differential A/D converter 122 stops operating when the control signal ADCTRL is input.

(Configuration Example of Power Generation Unit)

FIG. 2 is an illustrative diagram showing an example of a configuration of the power generation unit 200 provided in the flow rate sensor 10 in FIG. 1.

The power generation unit 200 includes a plurality of resistors 202 and stabilizing capacitances 204, 205, and generates the above-mentioned detection reference potential V3 and the reference potential VB.

The plurality of resistors 202 generate the detection reference potential V3 and the reference potential VB by a so-called resistance string series-connected between an analog reference potential 201 and a reference potential 203.

Fluctuations in the reference potential VB affect the potentials of the detection node VDETP and the detection node VDETM. Therefore, when the potentials of the detection nodes VDETP, VDETM are determined by the comparator 145 in FIG. 1 with reference to the detection reference potential V3, it is preferable that the reference potential VB and the detection reference potential V3 fluctuate to a same extent.

In order for the reference potential VB and the detection reference potential V3 to fluctuate to the same extent, as shown in FIG. 2, it is preferable to generate the reference potential VB and the detection reference potential V3 from the same resistor string.

In the resistor string, the stabilizing capacitance 204 and the stabilizing capacitance 205 are respectively connected to nodes that output the detection reference potential V3 and the reference potential VB. Accordingly, the potentials of the detection reference potential V3 and the reference potential VB are stabilized.

However, since the stabilizing capacitances 204, 205 increase a chip area and eventually lead to an increase in a chip cost, it is preferable to keep capacitance values of the stabilizing capacitances 204, 205 to a minimum necessary value.

(Configuration Example of Analog Switch)

FIG. 3 is an illustrative diagram showing an example of a configuration of the analog switch 112 provided in the flow rate sensor 10 in FIG. 1.

As shown in FIG. 3, the analog switch 112 includes a transistor 301 of a P-channel metal oxide semiconductor (MOS) and a transistor 302 of an N-channel MOS. FIG. 3 shows the configuration example of the analog switch 112, and other analog switches have the same configuration as the analog switch 112 in FIG. 3.

The clock P1B is input to a gate of the transistor 301, and the clock P1 is input to a gate of the transistor 302. By adopting a structure in which the transistor 301 and the transistor 302 are parallel-connected, a potential can be transmitted from the GND potential to a power supply voltage without loss.

(Example of Signal Timing of Detection Unit)

FIG. 4 is a timing chart schematically showing timings of signals of units in the disconnection detection unit 131 provided in the flow rate sensor 10 in FIG. 1.

In FIG. 4, from an upper part to a lower part, signal timings of the clock P1, the clock P1B, the clock P2, the clock P2B, the node VM, the input unit VINM of the control circuit 110, and the detection node VDETM are shown.

FIG. 4 shows a state in which the output unit ELEMOM and the input unit VINM in FIG. 1 are changed from conductive to non-conductive, and specifically, FIG. 4 shows changes in potential states of the node VM and the detection node VDETM before the disconnection of the bonding wire 165 (Connected in FIG. 4) and after the disconnection of the bonding wire 165 (Disconnected in FIG. 4).

In a period t0, which is a period of one cycle of the clocks P1 and P2 in FIG. 4, a period t1 in which the clock P1 is in a HIGH state and a period t2 in which the clock P2 is in the HIGH state are respectively provided with overlap periods t3, t4, so that rise and fall edges do not overlap. Accordingly, influence of a clock feed-through induced during the operation of the analog switch can be reduced.

When the node VM is not disconnected, during the period t1 of P1=HIGH and the overlap period t3, the node VM is at a level of a potential VSIG which is an output level of the resistance bridge 100. During the subsequent period t2 of clock P2=HIGH and the overlap period t4, the node VM is at a level of the detection reference potential V1. This is because a voltage across the detection capacitance 141 is short-circuited by the analog switch 142.

In the example in FIG. 4, a case of the detection reference potential V1=GND is shown. When the bonding wire 165 is disconnected, during the period t1 and the period t3, an operation changes so that the input unit VINM reaches a level of reference potential VB−potential fluctuation DVDET.

This is because in FIG. 1, |VB−V1| is changed to a potential of |VB−V1|*CIN/(CIN+C1) obtained by dividing |VB−V1| by a potential of the node CMI and the potential of the detection capacitance 141.

Since the potential fluctuation DVDET is a change with respect to the reference potential VB of the detection node VDET, when the detection reference potential V1=0, DVDET=VB−V1*CIN/(CIN+C1)=VB*C1/(CIN+C1) is established.

A potential of the input unit VINM is a potential input to the N-side input unit ADINM of the differential A/D converter 122. Therefore, when the bonding wire 165 is not disconnected, a state of the signal level VSIG output from the resistance bridge 100 is maintained.

When the disconnection of the bonding wire 165 occurs, during the period t1 and the period t3, the disconnection detection unit 131 is connected to the input unit VINM of the control circuit 110, so that the input unit VINM and the node VM have the same potential of |VB−V1| *CIN/(CIN+C1).

A disconnection detection potential in the detection node VDETM does not fluctuate at the timing when the disconnection occurs, but fluctuates only in the first period t1 after the disconnection. At this time, when the potential of the detection node VDETM decreases below the detection reference potential V3, the disconnection detection unit 131 determines that the bonding wire 165 is disconnected.

(Setting of Detection Capacitance)

FIG. 5 is an illustrative diagram showing relation between a capacitance ratio of the N-side input capacitance 117 to the detection capacitance 141 and a voltage ratio of the potential fluctuation DVDET to the reference potential VB that are provided in the flow rate sensor 10 in FIG. 1.

FIG. 5 shows the relation between C1/CIN (capacitance ratio of the electrostatic capacitance value C1 of the detection capacitance 141 to the electrostatic capacitance value CIN of the N-side input capacitance 117) and DVDET/VB (voltage ratio of the potential fluctuation DVDET to the reference potential VB) when, for example, the detection reference potential V1=0. As signal strength of the potential fluctuation DVDET of the detection node increases, disconnection detection becomes easier, and therefore, it is better that DVDET/VB becomes closer to 1.

For that purpose, it is necessary to increase the electrostatic capacitance value C1 of the detection capacitance 141, but when the electrostatic capacitance value of the detection capacitance 141 increases, the circuit area becomes large. Considering this, in the design of the electrostatic capacitance value C1 of the detection capacitance 141, it is more effective and preferable when C1/CIN=approximately 0.5 to 1.0.

FIG. 6 is an illustrative diagram showing dependence of the detection capacitance 141 provided in the flow rate sensor 10 in FIG. 1.

FIG. 6 shows the dependence of the detection capacitance 141 on the voltage ratio of the potential fluctuation DVDET to the reference potential VB in cases in which the electrostatic capacitance value CIN of the N-side input capacitance 117 is approximately 1 pF to 4 pF when the detection reference potential V1=0.

As shown in FIG. 6, in a case in which the electrostatic capacitance value of the N-side input capacitance 117 is small, even when the electrostatic capacitance value C1 of the detection capacitance 141 is 2 pF or less, the relatively large signal strength of the potential fluctuation DVDET can be obtained. However, it can be seen that in a case in which the electrostatic capacitance value of the N-side input capacitance 117 is large, the potential fluctuation DVDET having the same signal strength cannot be obtained unless the electrostatic capacitance value C1 of the detection capacitance 141 is set larger.

In order to improve noise performance of the differential A/D converter 122, it is necessary to increase the electrostatic capacitance values of the input capacitances 116, 117. However, in this case, it means that the electrostatic capacitance value of the detection capacitance 141 needs to be increased at the same time.

Next, to what extent the electrostatic capacitance values of the detection capacitance 141 and the holding capacitance 144 are allowed will be described.

FIG. 7 is an illustrative diagram showing examples of signal characteristics generated by an electrostatic capacitance sum of the detection capacitance 141 and the holding capacitance 144 that are provided in the flow rate sensor 10 in FIG. 1.

FIG. 7(a) shows relation between signal transmission delay times generated by the capacitance sum of the detection capacitance 141 and the holding capacitance 144, and schematically shows how the delay in the circuit operation of the A/D converter 122 increases as the electrostatic capacitance sum of the detection capacitance 141 and the holding capacitance 144 increases.

FIGS. 5 and 6 show that as the electrostatic capacitance value of the detection capacitance 141 increases, the potential fluctuation DVDET having larger signal strength is obtained. However, when the electrostatic capacitance value of the detection capacitance 141 is too large, not only the chip area increases as described above, but also signal delay becomes long and exceeds an allowable delay time DelayLim, which is a delay time that is allowable.

Here, the allowable delay time DelayLim is determined by an operation frequency of the sampling hold type differential A/D converter 122. When the differential A/D converter 122 adopts an oversampling method, as the operation frequency increases, accuracy becomes higher. However, at this time, a value of the allowable delay time DelayLim decreases, and an allowable value of the capacitance sum of the detection capacitance 141 and the holding capacitance 144 becomes small.

Since it can be said that the value of the allowable delay time DelayLim is a time required for settling the potential of the input node of the differential A/D converter 122, when the signal strength required for the disconnection detection is determined by the method, it is necessary to determine a sampling frequency of the differential A/D converter 122 according to the allowable delay time DelayLim at that time.

As described above, when the electrostatic capacitance values of the detection capacitance 141 and the holding capacitance 144 are to be determined, the operation frequency of the differential A/D converter 122 needs to be taken into consideration, so that the electrostatic capacitance value of the detection capacitance 141 can be determined based on relation with the sampling frequency of the differential A/D converter 122.

FIG. 7(b) shows relation between the electrostatic capacitance sum of the detection capacitance 141 and the holding capacitance 144 and an input impedance of the differential A/D converter 122.

The differential A/D converter 122 connected to the resistance bridge 100 converts an analog resistance value into a digital value, so that as the input impedance increases, a higher accuracy operation can be performed. On the other hand, when the electrostatic capacitance sum of the detection capacitance 141 and the holding capacitance 144 increases, the input impedance becomes small, and performance of the flow rate sensor 10 deteriorates.

The capacitance sum of the detection capacitance 141 and the holding capacitance 144 needs to be set, so that the input impedance is larger than an allowable impedance value ImpedanceLim determined by magnitude of the resistance value constituting the resistance bridge 100.

As described above, the electrostatic capacitance values of the detection capacitance 141 and the holding capacitance 144 need to be appropriately set to a value that simultaneously satisfies both the allowable delay time DelayLim, which is the method of the circuit operation delay of the differential A/D converter 122, and the allowable impedance value ImpedanceLim, which is the input impedance method. In this way, the electrostatic capacitance values of the detection capacitance 141 and the holding capacitance 144 are determined.

(Operation Range of Disconnection Detection Circuit)

FIG. 8 is an illustrative diagram showing an example of an operation window in a circuit operation in the disconnection detection circuit 130 provided in the flow rate sensor 10 in FIG. 1.

FIG. 8 schematically shows relation between voltages when the detection reference potential V1 in FIG. 1 is smaller than the reference potential VB.

A common mode voltage of the resistance bridge 100 fluctuates within a certain range as shown in a common mode voltage fluctuation amount DVCOM in FIG. 8 due to manufacturing variations in the resistance values and the like. When a maximum value SIGMAX of the signal from the resistance bridge 100 is output from this lower limit, the potential of the detection node VDET decreases to a potential NormalLim.

Since the potential of the detection node VDET decreases to the potential NormalLim even when the disconnection does not occur, the detection reference potential V3 input to the comparator 145 needs to be lower than the potential NormalLim.

On the other hand, since the potential fluctuation DVDET is designed by the ratio of the electrostatic capacitance value of the input capacitance 116 (or the input capacitance 117) to the electrostatic capacitance value of the detection capacitance 141, the potential fluctuation DVDET during the disconnection can be lowered only to a potential VdetLim.

That is, an operation window DIAGWIN is between the potential NormalLim and the potential VdetLim. The detection reference potential V3 needs to be set in this operation window DIAGWIN while considering variations of the comparator 145 and a change in an environmental temperature.

In this case, considering that a variation of the potential VdetLim is small, it is preferable to set the detection reference potential V3 to satisfy V3<(NormalLim−VdetLim)/2.

FIG. 9 is an illustrative diagram showing another example of a window in a circuit operation in the disconnection detection circuit 130 provided in the flow rate sensor 10 in FIG. 1.

FIG. 9 shows an operation window in the disconnection detection circuit 130 when the detection reference potential V1 is set to be larger than the reference potential VB.

In FIG. 9, as in FIG. 8, it is preferable to set the detection reference potential V3 to satisfy V3>(VdetLim−NormalLim)/2.

FIG. 10 is an illustrative diagram showing an example of a configuration of a control system 350 provided with the flow rate sensor 10 in FIG. 1.

The control system in FIG. 10 is, for example, an engine control system that manages engine control. The engine controlled by this engine control system is an internal combustion engine, which is an engine used in, for example, an automobile or a generator.

As shown in FIG. 10, the control system 350 includes an air flow rate control module 351, a control module 352, and the controller 353. The air flow rate control module 351 is a module that adjusts an amount of air supplied to the engine, and includes the flow rate sensor 10 and a flow rate controller 355.

The flow rate controller 355 controls the amount of the air supplied to the engine based on a result in the sensor signal SENOUT output from the flow rate sensor 10. The control module 352 includes various controllers that control the engine, such as a throttle controller and an injector controller.

The throttle controller controls a throttle opening, that is, an amount of fuel supplied to the engine and the like. The injector controller controls an operation of an injector that injects fuel into an intake port or the like of the engine.

The controller 353 controls the entire control system 350. Specifically, the entire control system 350 is controlled based on an input and output signal FLOWCTRL input into and output from the air flow rate control module 351 and an input and output signal MODULECTRL input into and output from the control module 352.

Here, an example in which the flow rate sensor 10 is used for an engine of an automobile or the like has been described. However, a sensor that uses a resistance bridge as a detection principle can be applied to various other sensors such as a sensor that measures pressure and strain.

As described above, by detecting the potential of the input node of the differential A/D converter 122 only when the sampling of the differential A/D converter 122 is executed, the disconnection of the bonding wires 164, 165 can be detected with low noise.

Accordingly, the highly reliable flow rate sensor 10 can be implemented. By mounting the flow rate sensor 10 on the control system 350, reliability of the engine control can be improved.

Second Embodiment (Configuration Example and Operation of Flow Rate Sensor)

FIG. 11 is an illustrative diagram showing an example of a configuration of the flow rate sensor 10 according to a second embodiment.

The flow rate sensor 10 in FIG. 11 is different from the flow rate sensor 10 in FIG. 1 according to the first embodiment in operations of the analog switches 140, 142, 143 of the disconnection detection units 131, 132 and types of clock generated by the clock generation circuit 170. Since the configuration of the flow rate sensor 10 is the same as that of the flow rate sensor 10 in FIG. 1, description thereof will be omitted.

The clock generation circuit 170 generates clocks PD1, PD1B, PD2, PD2B in addition to the clocks P1, P1B, P2, P2B generated by the clock generation circuit 170 shown in FIG. 1. The clock PD1B is an inverted signal of the clock PD1, and the clock PD2B is an inverted signal of the clock PD2.

The analog switch 142 operates based on the clocks PD2, PD2B. The analog switches 140, 143 operate respectively based on the clocks PD1, PD1B. The clocks PD1, PD1B, PD2, PD2B are different clocks from the clocks P1, P1B, P2, P2B.

As described above, since the clocks PD1, PD1B, PD2, PD2B are different from the clocks P1, P2, which are operating clocks of the differential A/D converter 122, a difference from the first embodiment is that the disconnection detection circuit 130 and the differential A/D converter 122 operate based on different control clocks.

(Example of Signal Timing of Detection Unit)

FIG. 12 is a timing chart schematically showing a clock and an internal waveform in the disconnection detection unit 131 provided in the flow rate sensor 10 in FIG. 11.

FIG. 12 shows, from an upper part to a lower part, signal timings of the clock P1, the clock P2, the clock PD1, the clock PD2, the node VM of the disconnection detection unit 131, the input unit VINM of the control circuit 110, and the detection node VDETM.

The clocks P1, P2 are the control clocks of the differential A/D converter 122 as described in the first embodiment, and thus are the same as those in FIG. 4.

In the period t1, a HIGH period of the clock P1D is the same as that of the clock P1, but a LOW period of the clock P1D is different from that of the clock P1 in that one cycle of the clock P1D is as long as several cycles of the clock P1. Similarly, in the period t2, a HIGH period of the clock P2D is the same as that of the clock P2, but a LOW period of the clock P2D is different from that of the clock P2 in that one cycle of the clock P2D is as long as several cycles of the clock P2.

In this way, an operation frequency of the disconnection detection circuit 130 can be reduced to approximately ¼ as compared with that according to the first embodiment. Accordingly, noise from the disconnection detection circuit 130 superimposed on the differential A/D converter 122 can be reduced.

In addition, by reducing the operation frequency, power consumption associated with the operation of the disconnection detection circuit 130 can be reduced.

As described above, the flow rate sensor 10 that performs more accurate disconnection detection with low power consumption can be provided.

FIG. 12 shows an example in which the operation frequency of the disconnection detection circuit 130 is reduced to approximately ¼ as compared with the operation frequency of the differential A/D converter 122. However, as long as the operation frequency of the disconnection detection circuit 130 is lower than that of the sampling of the differential A/D converter 122, the operation frequency is not limited to ¼.

The operating clock of the differential A/D converter 122 is often as high as several hundred kHz due to the oversampling method. On the other hand, the frequency of the disconnection detection may be several hundred Hz, and the operation frequency of the disconnection detection circuit 130 can be reduced to approximately ¹⁄₁₀₀₀ of that of the differential A/D converter 122.

It is desirable that an extent to which the operation frequency of the disconnection detection circuit 130 is reduced is appropriately designed based on responsiveness required for the flow rate sensor 10 and the like.

While the invention made by the inventor has been described in detail based on the embodiments, the invention is not limited to the above-described embodiments, and various modifications can be made without departing from the scope of the invention.

The invention is not limited to the embodiments described above, and includes various modifications. For example, the embodiments described above have been described in detail for easy understanding of the invention, and are not necessarily limited to those having all the configurations described.

Apart of the configuration of one embodiment can be replaced with the configuration of another embodiment, and the configuration according to another embodiment can be added to the configuration according to one embodiment. A part of the configuration according to each embodiment may be added, deleted, or replaced with another configuration.

REFERENCE SIGNS LIST

10 flow rate sensor
100 resistance bridge
102 resistor
103 resistor
104 resistor
105 resistor
110 control circuit
111 input processing unit
112 analog switch
113 analog switch
114 analog switch
116 P-side input capacitance
117 N-side input capacitance
118 analog switch
119 analog switch
120 analog switch
121 analog switch
122 differential A/D converter
130 disconnection detection circuit
131 disconnection detection unit
132 disconnection detection unit
133 determination unit
140 analog switch
141 detection capacitance
142 analog switch
143 analog switch
144 holding capacitance
145 comparator
164 bonding wire
165 bonding wire
170 clock generation circuit
180 logic unit
200 power generation unit
202 resistor
204 stabilizing capacitance
205 stabilizing capacitance
301 transistor
302 transistor
350 control system
351 air flow rate control module
352 control module
353 controller
355 flow rate controller

The invention claimed is:

1. A flow rate sensor comprising:
a sensor unit configured to detect a change in a gas flow rate;
a switched capacitor type A/D converter configured to convert an analog signal output from the sensor unit into a digital signal; and
a disconnection detection circuit configured to detect disconnection of a wiring that connects the A/D converter and the sensor unit, wherein
the disconnection detection circuit includes a first capacitor whose one connection portion is connected to an input node of the A/D converter, and a detection unit configured to detect the disconnection of the wiring, and
the detection unit detects the disconnection of the wiring from a potential based on a ratio of each of electrostatic capacitances of input capacitors connected to operation input units of the A/D converter to an electrostatic capacitance of the first capacitor.

2. The flow rate sensor according to claim 1, wherein
the disconnection detection circuit further includes a second capacitor whose one connection portion is connected to an input node of the A/D converter and that is configured to hold an electric charge of a potential in the first capacitor, and
the detection unit detects the disconnection of the wiring based on a potential fluctuation of the second capacitor.

3. The flow rate sensor according to claim 2, wherein
the second capacitor stores electric charges by a potential based on a ratio of the input capacitor to the first capacitor.

4. The flow rate sensor according to claim 2, wherein
the second capacitor stores electric charges when the A/D converter captures the analog signal, and is disconnected from the wiring during a period when the input capacitor executes sampling of the signal.

5. The flow rate sensor according to claim 2, wherein
a first detection reference potential is supplied to another connection portion of the first capacitor, and
a second detection reference potential that is different from the first detection reference potential is supplied to another connection portion of the second capacitor.

6. The flow rate sensor according to claim 2, wherein
the detection unit includes a comparator, compares the potential based on the ratio of the electrostatic capacitance of the input capacitor to the electrostatic capacitance of the first capacitor with a preset reference potential, and detects that the wiring is disconnected when the potential based on the ratio of the electrostatic capacitance of the input capacitor to the electrostatic capacitance of the first capacitor becomes lower than the reference potential.

7. The flow rate sensor according to claim 6, wherein the second capacitor is a gate capacitance of an input transistor constituting the comparator.

8. The flow rate sensor according to claim 6, wherein the second capacitor is a parasitic capacitance of a wiring connected to an input unit of the comparator.

9. The flow rate sensor according to claim 1, wherein an electrostatic capacitance value of the first capacitor is set so as to satisfy an allowable circuit operation delay time and an allowable input impedance of the A/D converter based on an operation frequency of the A/D converter.

10. The flow rate sensor according to claim 1, wherein an electrostatic capacitance value of the first capacitor is smaller than an electrostatic capacitance value of the input capacitor connected to the A/D converter.

11. The flow rate sensor according to claim 1, wherein an operation frequency of the A/D converter is set based on a circuit operation delay of the A/D converter determined based on the input capacitor connected to the A/D converter and an electrostatic capacitance of the first capacitor.

12. A flow rate sensor comprising:
a sensor unit configured to detect a change in a gas flow rate;
a clock generation circuit configured to generate a first control clock and a second control clock;
a differential input switched capacitor type A/D converter configured to operate based on the first control clock and convert a differential analog signal output from the sensor unit into a digital signal;
a disconnection detection circuit configured to detect disconnection of a wiring that connects the A/D converter and the sensor unit;
a first input capacitor connected between one output unit of the sensor unit and one input unit of the A/D converter;
a first switch configured to switch connection between the one input unit of the A/D converter and the first input capacitor based on the first control clock generated by the clock generation circuit;
a second switch configured to switch connection between another input unit of the A/D converter and the first input capacitor based on the second control clock;
a second input capacitor connected between another output unit of the sensor unit and another input unit of the A/D converter;
a third switch configured to switch connection between one input unit of the A/D converter and the second input capacitor based on the second control clock; and
a fourth switch configured to switch connection between another input unit of the A/D converter and the second input capacitor based on the first control clock, wherein
the disconnection detection circuit includes a first disconnection detection unit configured to detect disconnection of one wiring connected to the sensor unit, a second disconnection detection unit configured to detect disconnection of another wiring connected to the sensor unit, and a disconnection determination unit configured to determine whether or not the wiring is disconnected based on detection results of the first disconnection detection unit and the second disconnection detection unit,
the first disconnection detection unit includes a first capacitor connected between the one wiring and a first reference voltage, a fifth switch configured to switch connection between the wiring and the first capacitor based on the second control clock, a sixth switch configured to reset the first capacitor based on the first control clock, a seventh switch configured to switch connection between the first capacitor and the first input capacitor based on the second control clock, and a first detection unit configured to detect the disconnection of the wiring,
the second disconnection detection unit includes a second capacitor connected between the other wiring and the first reference voltage, an eighth switch configured to switch connection between the other wiring and the second capacitor based on the second control clock, a ninth switch configured to discharge the second capacitor based on the first control clock, a tenth switch configured to switch connection between the second capacitor and the second input capacitor based on the second control clock, and a second detection unit configured to detect the disconnection of the wiring,
connection of the second switch, the third switch, the fifth switch, the seventh switch, the eighth switch, and the tenth switch are switched, so that during a sampling operation of the A/D converter, potentials of input nodes of the A/D converter are input to a respective one of the first disconnection detection unit and the second disconnection detection unit, and
the first detection unit and the second detection unit detect the disconnection of the wiring based on the potential of the input node of the A/D converter input during the sampling operation of the A/D converter.

13. The flow rate sensor according to claim 12, wherein the disconnection determination unit determines that the wiring is disconnected when either the first disconnection detection unit or the second disconnection detection unit detects the disconnection, and outputs a disconnection detection signal.

14. The flow rate sensor according to claim 12, wherein the second control clock generated by the clock generation circuit is a clock having a frequency different from that of the first control clock.

15. The flow rate sensor according to claim 12, wherein the second control clock generated by the clock generation circuit has a period longer than a period of the first control clock.

* * * * *